United States Patent [19]
Blum et al.

[11] 3,936,322
[45] Feb. 3, 1976

[54] METHOD OF MAKING A DOUBLE HETEROJUNCTION DIODE LASER

[75] Inventors: Joseph M. Blum, Yorktown Heights; Billy L. Crowder; James C. McGroddy, both of Putnam Valley, all of N.Y.

[73] Assignee: International Business Machines Corporation, Armonk, N.Y.

[22] Filed: July 29, 1974

[21] Appl. No.: 492,667

[52] U.S. Cl. ............... 148/1.5; 331/94.5 H; 357/91
[51] Int. Cl.² ......................................... H01L 21/26
[58] Field of Search ........ 148/1.5; 331/94.5; 357/91

[56] References Cited
UNITED STATES PATENTS

| | | | |
|---|---|---|---|
| 3,245,002 | 4/1966 | Hall | 331/94.5 |
| 3,617,929 | 11/1971 | Strack et al. | 148/1.5 X |
| 3,622,382 | 11/1971 | Brack et al. | 148/1.5 X |
| 3,649,369 | 3/1972 | Hunsperger et al. | 148/1.5 |
| 3,691,476 | 9/1972 | Hayashi | 331/94.5 |

OTHER PUBLICATIONS

"Ion Implantation in Semiconductors and other Materials", Favennec et al., B. L. Crowder, Ed., Plenum Press, New York, 1973, pp. 621–630.

*Primary Examiner*—Dewayne Rutledge
*Assistant Examiner*—J. M. Davis
*Attorney, Agent, or Firm*—George Baron

[57] ABSTRACT

A method for improving the current confinement capacity of a double heterojunction laser by using a high energy implantation of oxygen in the regions of an injection laser surrounding the active region of such laser so as to make such regions semi-insulating.

7 Claims, 6 Drawing Figures

METHOD OF MAKING A DOUBLE HETEROJUNCTION DIODE LASER

BACKGROUND OF THE INVENTION

One of the first successful fabrications of a continuously operating double-heterojunction (DH) laser at room temperature was reported by I. Hayashi et al. in the Applied Physics Letters of 1970, Volume 17, Pages 109+. Such a laser is comprised of an n-type GaAs substrate and four epitaxial layers comprised of an n-type $Ga_{(1-x)}Al_xAs$ layer followed by successively built up layers of p-type GaAs, p-type $Ga_{(1-x)}Al_xAs$ and p-type GaAs. The end product is a single GaAs region surrounded by two heterojunctions, namely, a p-p heterojunction and a p-n heterojunction. When provided with an appropriate resonator, the DH laser exhibits lower thresholds at higher temperatures than are attainable by a single heterojunction laser.

The early DH laser had the disadvantage that the current that produced the necessary carrier injection across a junction for the ultimate light-producing recombination step took place across a relatively large area of the junction. This makes control over the modes of oscillation and removal of the heat from the junction difficult. It was found necessary to fabricate a DH laser so that the active region of the laser was narrowed, confining the carrier injection region to a narrow stripe. Such confinement of the current, hence carrier injection region, to this narrow stripe would facilitate the removal of heat from the junction region and provide laser operation at low threshold currents.

One well known way of obtaining such current confinement is to etch away areas on both sides of a narrow stripe of the active region of the DH laser so that current that produces lasing will only pass through this narrowed region. The portion of the multilayered DH laser that is unetched stands higher than the remaining portion of the laser very much like a mesa rock formation, hence the term "mesa etched."

In another article entitled "Continuous Operation of GaAs-$Ga_{(1-x)}Al_xAs$ Double-Heterostructure Lasers with 30°C Half-Lives Exceeding 1000 Hours," by R. L. Hartman et al. which appeared in Applied Physics Letters, Vol. 23, No. 4, Aug. 15, 1973, pp. 181–183, the narrowed region of lasing or current confinement is attained by bombarding both sides of a chosen narrow strip of the active region with protons. Such proton bombardment can achieve a lasing stripe width of only 13 microns in that the proton bombarded regions becomes so highly resistive that carrier-injection current can only traverse the unbombarded regions.

It has been found that where proton bombardment is used to attain the high resistivity, no current flow, regions, the bombarded regions are unstable when heated about 350°C. Moreover, the regions adjacent to the active region are damaged, causing increased optical loss in the narrow stripe regions. Additionally, it has been observed that the crystalline damage caused by proton bombardment, close to the active region of the DH laser, will favor and enhance the unwanted diffusion of impurities into that active region. It is also believed that the dark lines that occur in degrading DH lasers may be due to lack of crystalline perfection, and proton bombardment produces such crystalline imperfection.

Where mesa etch is relied upon to achieve current confinement through the DH laser, the end product is a non-planar device having exposed junction edges. Such non-planarity adds to the difficulty of mounting the DH laser to a heat sink, and the exposed edges require additional fabrication steps to passivate.

Two other means have been utilized to obtain the desired current confinement in DH lasers. In one means the electrical contact on the p-type GaAs top layer is made through a conventional oxide mask in such a fashion that the electrical contact does not cover the entire area but only a stripe running from one cleaved face to the other. Depending on the electrical resistivity of the top layers, this has the effect of causing the current flow to occur predominantly in the region below the stripe, although some spreading occurs.

Current confinement to stripes has also been achieved by others by growing the top two layers n-type rather than p-type and diffusing a p-type dopant in the form of a stripe in the region where current flow is desired.

GENERAL DESCRIPTION OF THE INVENTION

It would be highly desirable to achieve the desired confinement of current to a very narrow stripe in a DH laser without the concommitant drawbacks noted above when mesa etching, proton bombardment or other methods are used. A method which achieves such active narrowing without diminishing the life of DH laser consists in implanting oxygen ions, at energies of 1.5–3.0 million electron volts, into the DH laser to achieve very high resistive regions on both sides of a very narrow line of the laser. Oxygen implantation serves to make either n- or p-type GaAs highly resistive and when such implantation takes place, it is as a chemical dopant. It any damage is introduced into the crystalline structure of the GaAs due to the oxygen implantation, such damage can be removed by annealing; and the DH laser's operation remains stable even if the annealing temperature is as high as 800°C.

DETAILED DESCRIPTION OF THE INVENTION

Figure 1:
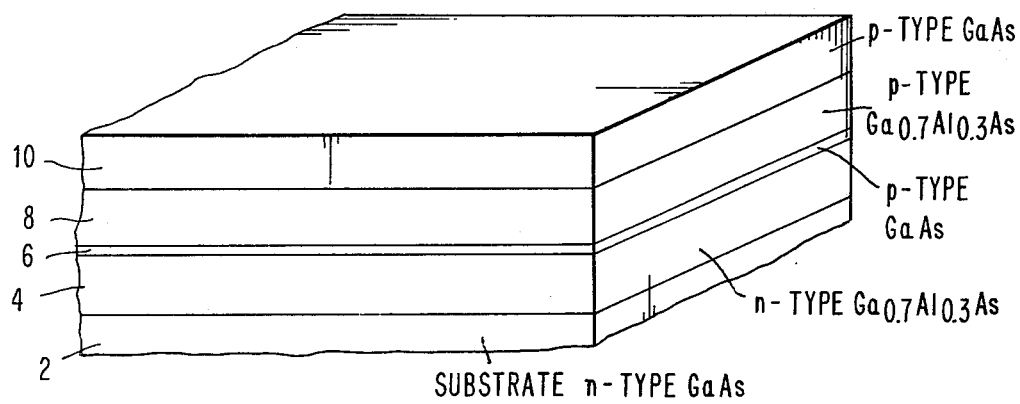
FIG. 1 shows the prior art structure of the semiconductor portion of a DH laser.

FIG. 1 depicts a conventional, prior art, double heterojunction laser L that comprises a substrate 2 of n-type GaAs, over which are grown, by standard liquid phase epitaxial growth, a 2–5$\mu$ alayer 4 of n-type $Ga_{0.7}Al_{0.3}As$, a 0.3$\mu$ layer 6 of GaAs, a 1$\mu$ layer 8 of p-type $Ga_{0.7}Al_{0.3}As$, and a 1$\mu$ layer 10 of p-type GaAs. The active region, or region where recombination of electrons and holes takes place to produce light during the normal operating state of the DH laser, is in the 0.3$\mu$ region of the GaAs between the $Ga_{0.7}Al_{0.3}As$ regions 4 and 8. When electrodes or contacts, not shown, are provided to the most removed surfaces of the DH laser so that current can traverse all five layers to produce laser action, the current required is large because the whole width of the device is active rather than a narrow region.

Figure 2:
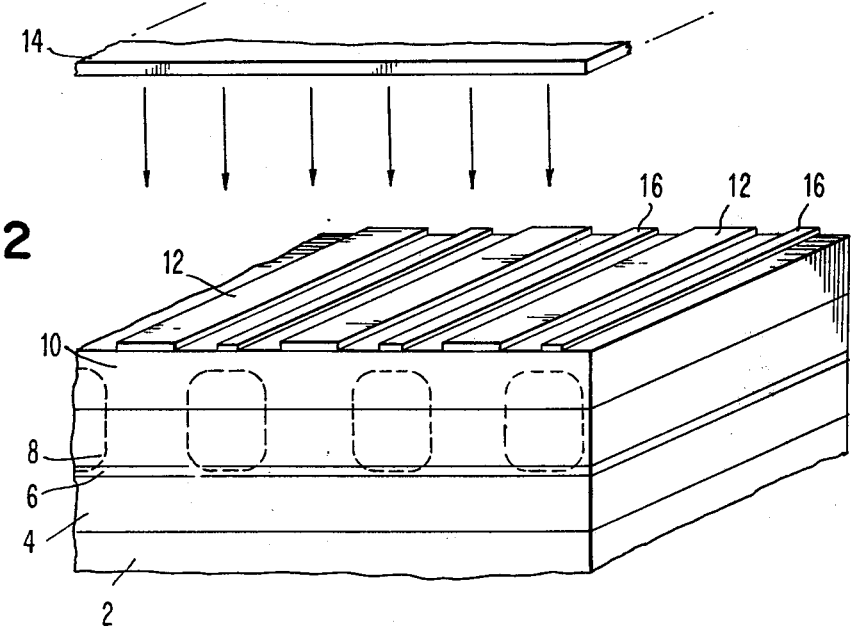
FIG. 2 sets forth the preferred embodiment of the invention.

FIG. 2 depicts the initial stage of how such current restraint to a narrow region of the laser is attained. Atop of the GaAs layer 10 are deposited uniform bars 12 of metal, serving as ion implant masks, the widths of such bars 12 being about 6 – 25 microns, with 6 microns being the preferred width. The thickness of each bar 12 should be such that for the intensity of oxygen ions to be implanted into layers 10 and 8 of the DH laser from ion source 14 such bars 12 will prevent the ions from penetrating into layer 10, or into any other layer below it. Between such bars 12 are deposited markers 16, which are substantially thinner than the masking bars 12. When oxygen ions are implanted into layers 10 and 8, the thick masking bars 12 prevent the entry of oxygen but the markers provide negligible interference to such entry of ions.

Figure 4:
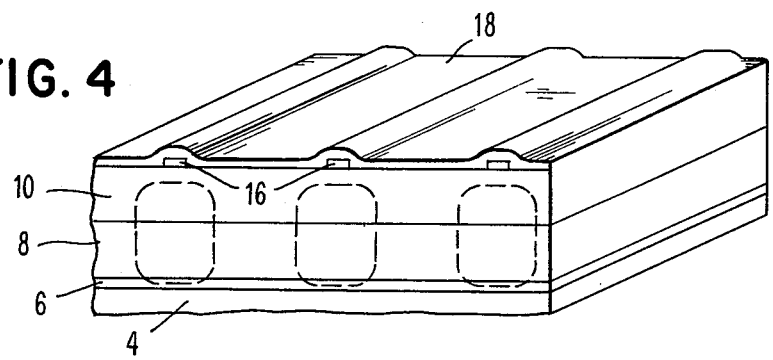
FIG. 4 depicts an intermediary step for applying an electrode to the DH laser prior to achieving the final product shown in FIG. 5.
Figure 5:
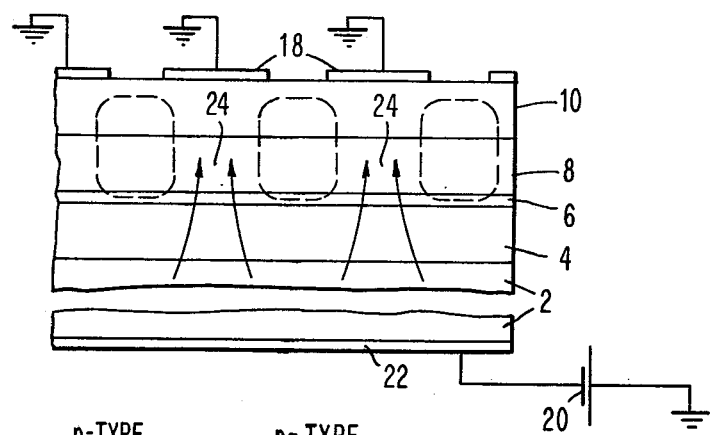
Figure 6:
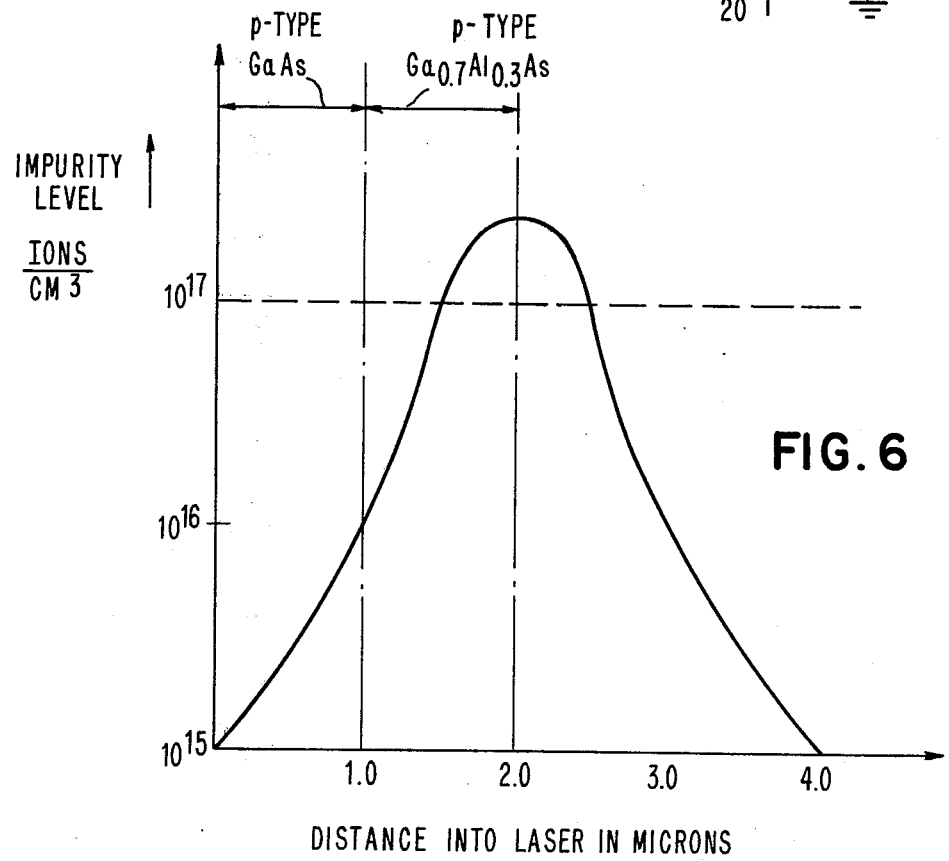
FIG. 6 is a plot of implanted oxygen ion concentration as a function of distance into the two upper layers of the DH laser.

Masks 12 can be stencils made of nickel, gold or evaporated metal masks. The could also be applied using a photoresist material. The markers 16 are made of aluminum oxide produced by deposition and photo-etching steps. The oxygen ions are implanted into layers 10 and 8 at an energy of 1.8 million electron-volts at a dosage of $1 \times 10^{14}$ ions/cm$^2$. As seen in FIG. 6, the GaAs and GaAlAs layers 10 and 8, respectively, have their own concentration of impurity levels determined by the concentration of impurities in the solutions from which these layers were grown. The function of the oxygen ions is to serve as deep level impurities. These deep level impurities serve as electronic carrier "sinks" for permanently trapping carriers, thus making semi-insulators out of the regions treated with such oxygen ions. In the materials used for making a DH laser, the GaAs and GaAlAs themselves have many ionized impurities at room temperature, approximately $1 \times 10^{17}$ ions/cm$^3$. Consequently, the density of deep level traps produced by oxygen ion bombardment should be greater than this density so that all free electrons or holes in these materials are permanently trapped by the implanted oxygen ions, assuring negligible, if any, current flow through the bombarded regions. The implantation of a dose of $1 \times 10^{14}$ ions/cm$^2$ or more when distributed over a buried region of approximately $1 - 2\mu$ will provide sufficient carrier traps. Shaded densities of impurities shown in FIG. 6 are desirable to achieve current constraint, whereas impurity levels less than $10^{17}$ ions/cm$^3$ do not effectively achieve such current restraint. The dotted regions of FIG. 2, FIG. 4 and FIG. 5 indicate the regions that have been made into semi-insulators. Oxygen ions have been chosen to make GaAs and GaAlAs semi-insulating because they have a low atomic weight and need relatively little energy to make them penetrate layers 8 and 10. Chromium and iron ions are suggested alternates for oxygen ions to achieve the semi-insulating regions, but these are heavier ions and more energy is required to attain deep penetration into the GaAs and GaAlAs. Such increased energy will produce more damage in the GaAs and GaAlAs layers than oxygen ions do. The energy used for the implantation of the oxygen into layers 10 and 8 is such that subsequent annealing serves to remove the damage caused by the oxygen ions but does not remove the deep traps created by their presence.

Figure 3:
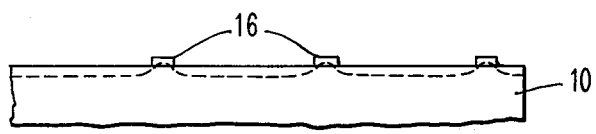
FIG. 3 is an illustration of a dopant diffusion step employed to assist in attaching an electrode to the DH laser.

In order to complete the DH laser, mask 12 is removed and the top surface of layer 10 (see FIG. 3) is highly doped by diffusion resulting in a surface concentration of $10^{20}$ atoms/cm$^3$ of zinc. Such doping enables a low resistance electrode 18 (See FIG. 4) to be contacted to the GaAs layer 10 and the doping takes place at a temperature of about 600°C, a temperature that removes the damage in the GaAs and GaAlAs due to the oxygen ion bombardment. After electrode 18 has been deposited, which electrode 18 can be made of layers of chrome-gold, but any low resistance metal could be used. The markers 16 and electrode 18 above it are selectively etched away, leaving individual electrode 18 regions for current to flow from battery 20, electrode 22, confined regions 24 to those confined regions. To make the completed device a laser array, cleaved mirrors are formed on both ends of the array, which mirrors are not shown in FIG. 5, but they are disposed perpendicular to electrode 18 and electrode 22.

The chart below shows the test results from lasers made from three different oxygen implantation dosages. It indicates that for the three separate groups of DH lasers that were made, that sample C, which had sufficient dosage of oxygen ions (at least $10^{17}$ ions/cm$^3$), produced a threshold current density of 1.8 K Amps/cm$^2$ Samples A and B which had oxygen dosages which produced trap concentrations less than $10^{17}$ ions/cm$^3$ produced threshold current densities of 9.7 K Amps/cm$^2$ and 8.9 K Amps/cm$^2$, respectively. A DH laser having a threshold current density greater than 2.5 K Amps/cm$^2$ is considered a poor laser.

|  | Sample | A | B | C |
|---|---|---|---|---|
| I | Thickness of Layer 10 | $1.1\mu$ | $1.1\mu$ | $1.1\mu$ |
| II | Thickness of Layer 8 | $0.6\mu$ | $0.6\mu$ | $0.6\mu$ |
| III | Thickness of Layer 6 | $1.0\mu$ | $1.0\mu$ | $1.0\mu$ |
| IV | Dopant for Region 6 | Si | Si | Si |
| V | Energy of Oxygen Ions | 1.8MeV | 1.8MeV | 1.8MeV |
| VI | Dosage of Oxygen (ions/cm$^2$) | $1 \times 10^{11}$ | $1 \times 10^{12}$ | $1 \times 10^{13}$ |
| VII | Oxygen Concentration in Layers 8–10 (Atoms/cm$^3$) | $1 \times 10^{15}$ | $1 \times 10^{16}$ | $1 \times 10^{17}$ |
| VIII | Threshold Current Density | 9.7 K Amps/cm$^2$ | 8.9 K Amps/cm$^2$ | 1.8 K Amps/cm$^2$ |

Not only has oxygen ion implantation for attaining semi-insulators produced higher yields in the fabrication of DH lasers, but using oxygen ions provides a forgiving method in that it eliminates the need to very accurately control a relatively low critical annealing temperature otherwise required to repair damage produced by proton bombardment.

As seen in FIG. 6, assume that the background impurity levels of both the GaAs 10 and $Ga_{(1-x)}Al_xAs$ layer 8 are $10^{17}$ atoms/cm$^3$ range, then only if the density of the implanted oxygen ions exceeds $10^{17}$ atoms/cm$^3$ will there be sufficient trapping of all the electrons in layers 8 and 10 by the traps produced by the oxygen ions.* If the density of the implanted oxygen ions (or atoms in that once the ions are implanted, they combine with electrons to become atoms) is less than $10^{17}$ atoms/cm$^3$, then the regions around the narrow stripe may still conduct because there are electrons not trapped by the deep level oxygen-produced traps.

* In the example illustrated in FIG. 6, a density of oxygen atoms of $5 \times 10^{17}$ atoms/cm$^3$ was achieved.

The chart noted hereinabove shows some test results on three lasers (identified as A, B, and C, respectively). In all examples, GaAs layer 10 is $1\mu$ thick, $Ga_{(1-x)}Al_xAs$ layer 8 is $0.6\mu$ thick and GaAs layer 6 is $1\mu$ thick. The next line, IV, shows that silicon was used as the dopant for the active region layer 6. In all cases, the energy of the implanted oxygen ions was 1.8MeV and the dosage of oxygen ions varied from $10^{11} - 10^{13}$ ions/cm$^2$ for the respective laser samples.** The diffusion of zinc into the layer 10 to enable one to make an electrode attachment to layer 10 took place at 600° from a source of $ZnAs_2$ and the time diffusion was 30 minutes. Such temperatures and times, coincidentally, annealed the laser so that the damage produced by oxygen implantation was repaired. The last column shows threshold current density for each sample and it is noted that samples A and B had, respectively, thresholds of 9.7 and 8.9 K Amps/cm$^2$ because the dosage of oxygen was insufficient. The threshold current of sample C was noticeably reduced to 1.8 K Amps/cm$^2$ because the oxygen ion implantation was sufficiently high.

**Since the width of the distribution of these ions into the material was on the order of $1\mu$ ($1 \times 10^{-4}$cm) the density of traps formed $$(\text{density} = \frac{\text{no. of oxygen ions}}{\text{volume}})$$

or for example $$(\frac{10^{13} \text{ions}}{cm^2 \times 1 \times 10^{-4} cm} = 1 \times 10^{17} \text{ traps/cm}^3)$$

varied from $1 \times 10^{15}$ to $1 \times 10^{17}$ per cm$^3$.

In summary, the use of oxygen ion implantation to make semi-insulators in a double heterojunction laser about a very narrow strip (about 6 –25 microns) makes the laser fabrication process more forgiving in that (a) oxygen is a deep level dopant, allowing for permanent electron traps, and (b) oxygen can remain in its host material even when the latter is heated to 800°C during the process of annealing to repair damage due to ion bombardment, or when zinc is being diffused at elevated temperatures into the GaAs layer 10 to enable that layer to accept a metal electrode layer. Moreover, whereas high resistivity regions produced by proton bombardment are unstable when heated above 350°C, oxygen implanted materials can be annealed to remove damage even at temperatures of 800°C, providing such materials, per se, can tolerate such temperatures. In addition, the completed laser device remains planar after oxygen implantation. This invention has been successfully applied to laser fabrication wherein the structure has been of this configuration p-p-p-n-n (substrate) or of the configuration having the opposite polarity (n-n-p-p-p (substrate)).

We claim:

1. In a method for making a narrow stripe double heterostructure junction laser having at least three superimposed layers wherein the first layer is GaAs, the second is $Ga_{(1-x)}Al_xAs$ and the third layer is GaAs, the latter region serving as the active region of the laser, the improvement comprising bombarding through all said layers, save for a very narrow region, with a beam of oxygen ions so as to dope said bombarded regions and make them non-conducting at the operating currents of said junction laser, and heating said layers after bombardment at a temperature of approximately 600°C for approximately 30 minutes.

2. In the method of claim 1 wherein said first two layers are of the order of 1 micron each in thickness.

3. In the method of claim 2 wherein the energy of said implanted oxygen is between 1.5 to 3.0 million electron volts.

4. In the method of claim 1 wherein the implanted oxygen ions have a density greater than the normal background impurity levels of the GaAs and $Ga_{(1-x)}Al_xAs$.

5. In the method of claim 1 wherein said non-bombarded regions has a width of 6 – 25 microns.

6. In the method of claim 1 wherein said oxygen ions are implanted at a density greater than $10^{17}$ ions/cm$^3$.

7. In a method for making a narrow stripe double heterostructure junction laser having at least three superimposed layers wherein said first layer is GaAs, the second is $Ga_{(1-x)}Al_xAs$ and the third layer is GaAs, the latter serving as the active region of the laser, the improvement comprising bombarding through all said layers, save for a very narrow region, with a beam of oxygen ions so as to make the bombarded regions non-conducting at the operating currents of said junction laser, said oxygen dosages being such as to produce trap concentrations in excess of the background impurity levels of said GaAs and $Ga_{(1-x)}Al_xAs$ layers.

* * * * *